(12) United States Patent
Josephson

(10) Patent No.: US 6,378,092 B1
(45) Date of Patent: Apr. 23, 2002

(54) INTEGRATED CIRCUIT TESTING

(75) Inventor: Don D Josephson, Ft Collins, CO (US)

(73) Assignees: Hewlett-Packard Company; Agilent Technologies Incorporated, both of Palo Alto, CA (US)

( * ) Notice: Subject to any disclaimer, the term of this patent is extended or adjusted under 35 U.S.C. 154(b) by 0 days.

(21) Appl. No.: 09/418,748

(22) Filed: Oct. 15, 1999

(51) Int. Cl.[7] ............................ G01R 31/28; H02H 3/05
(52) U.S. Cl. ............................ 714/724; 714/34; 714/39; 714/733; 714/734; 712/43; 712/227
(58) Field of Search .................. 714/736, 727, 714/725, 732, 734, 28, 32, 34, 724, 729, 733; 307/407; 712/43, 227; 377/54, 64; 703/28

(56) References Cited

U.S. PATENT DOCUMENTS

| | | | |
|---|---|---|---|
| 5,479,652 A | * 12/1995 | Dreyer et al. | 714/30 |
| 5,530,706 A |   6/1996 | Josephson et al. | 714/727 |
| 5,640,542 A | *  6/1997 | Whitsel et al. | 703/28 |
| 5,644,609 A | *  7/1997 | Bockhaus et al. | 377/64 |
| 5,867,644 A |   2/1999 | Ranson et al. | 714/39 |

* cited by examiner

*Primary Examiner*—Emmanuel L. Moise

(57) ABSTRACT

Integrated circuitry comprises target circuitry and test circuitry. The target circuitry uses a clock signal to transfer a target signal within the integrated circuitry. The test circuitry samples the target signal at a selected time from a plurality of possible times within a clock cycle of the clock signal. The test circuitry samples the target signal in response to a test signal indicating the selected time.

20 Claims, 4 Drawing Sheets

INTEGRATED CIRCUIT TESTING

BACKGROUND OF THE INVENTION

1. Field of the Invention

The invention is related to the field of integrated circuit testing, and in particular, to test circuitry in an integrated circuit that controls the time within a clock cycle when a test sample is obtained.

2. Statement of the Problem

Integrated circuits are tested to find manufacturing defects and performance deficiencies. Testing is often performed using test circuitry within the integrated circuit. The test circuitry samples signals within the integrated circuit and provides these test samples to an external test system for analysis. Integrated circuit testing is described in I.E.E.E. standard 1149.1

Some test circuits scan the values in storage elements to provide the test samples. Unfortunately, the operation of the integrated circuit is stopped to perform the scan, and the scan destroys the value in the storage element. To get the integrated circuit back to the state just prior to the scan, the integrated circuit is reset and must operate as before until the point of interruption. Both the scan and the reset process take time. In addition, the scan only obtains the static value in the storage element, and does not indicate time-varying signal problems, such as late arrival or glitches.

Other test circuits use redundant storage elements that passively receive the outputs from operational storage elements. An example of such a test circuit is described in U.S. Pat. No. 5,530,706 which is hereby incorporated by reference into this application. Some of these test circuits use a clock to sample the output. Other test circuits use pulses at the edge of the clock cycle to sample the output. Unfortunately, the output is continually sampled at the same time relative to the clock cycle. The lack of dynamic control over the sampling time makes it difficult to identify time-varying signal problems, such as late arrival or glitches.

Some test circuits use a trigger circuit to initiate testing. An example of such a trigger circuit is described in U.S. Pat. No. 5,867,644 which is hereby incorporated by reference into this application. Unfortunately, these test systems also fail to dynamically control the sampling time within a clock pulse.

SUMMARY OF THE SOLUTION

The invention solves the above problems with test circuitry that samples a target signal at selected times within a clock cycle. The ability to select times within the clock cycle facilitates testing to characterize time varying problems, such as signal delays and glitches. Thus, the test circuitry provides for the advanced testing of integrated circuit speed and system inter-operation.

The integrated circuitry comprises target circuitry and test circuitry. The target circuitry uses a clock signal to transfer a target signal within the integrated circuit. The test circuitry samples the target signal at a selected time from a plurality of possible times within a clock cycle of the clock signal. The test circuitry samples the target signal in response to a test signal indicating the selected time.

In various embodiments of the invention, the selected time is a delay from a time point in the clock signal. The test circuitry generates a pulse after the delay and samples the target signal in response to the pulse. In various embodiments of the invention, the test circuitry samples the target signal in response to a trigger. The test circuitry compares internal signals from the integrated circuitry to a trigger condition and generates a trigger signal if the internal signals match the trigger condition.

DETAILED DESCRIPTION OF THE INVENTION

Figure 1:
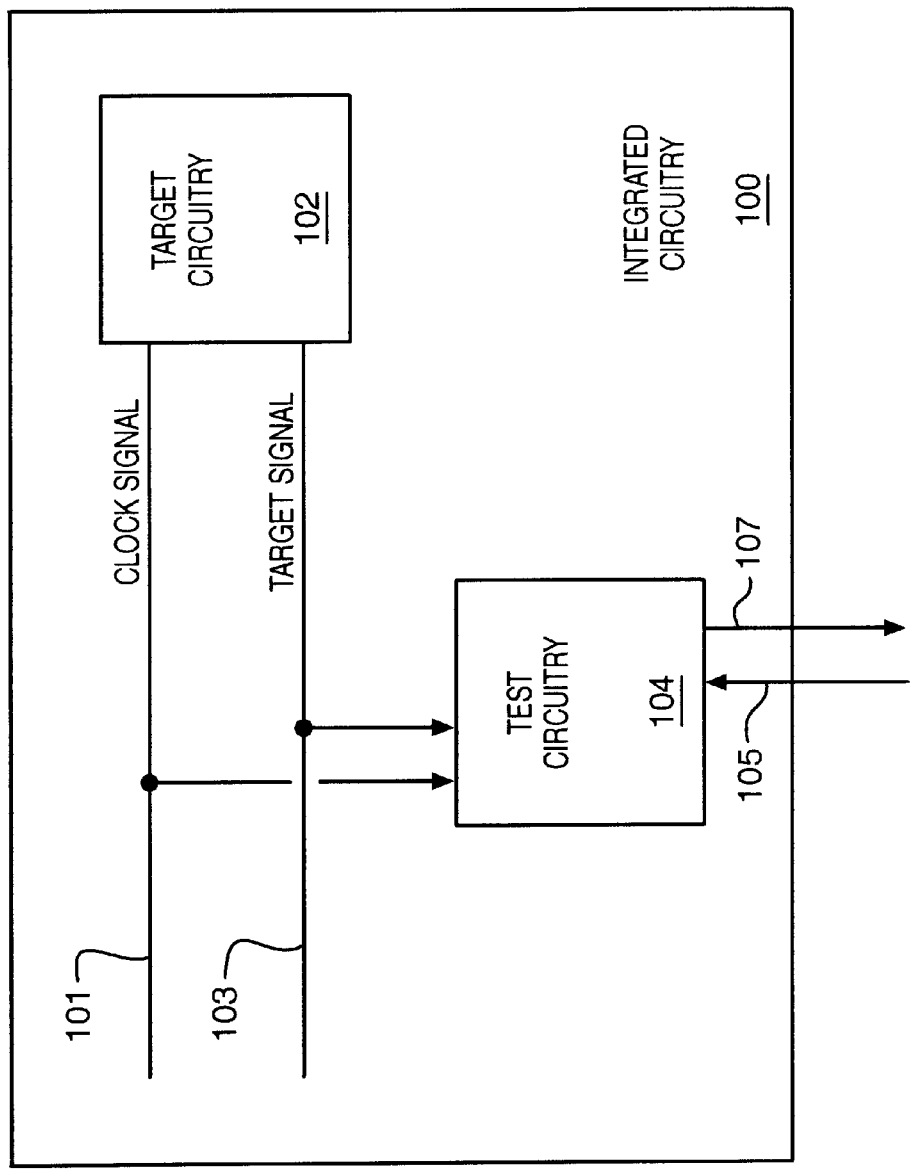
FIG. 1 is a block diagram of an integrated circuit in an example of the invention.
Figure 2:
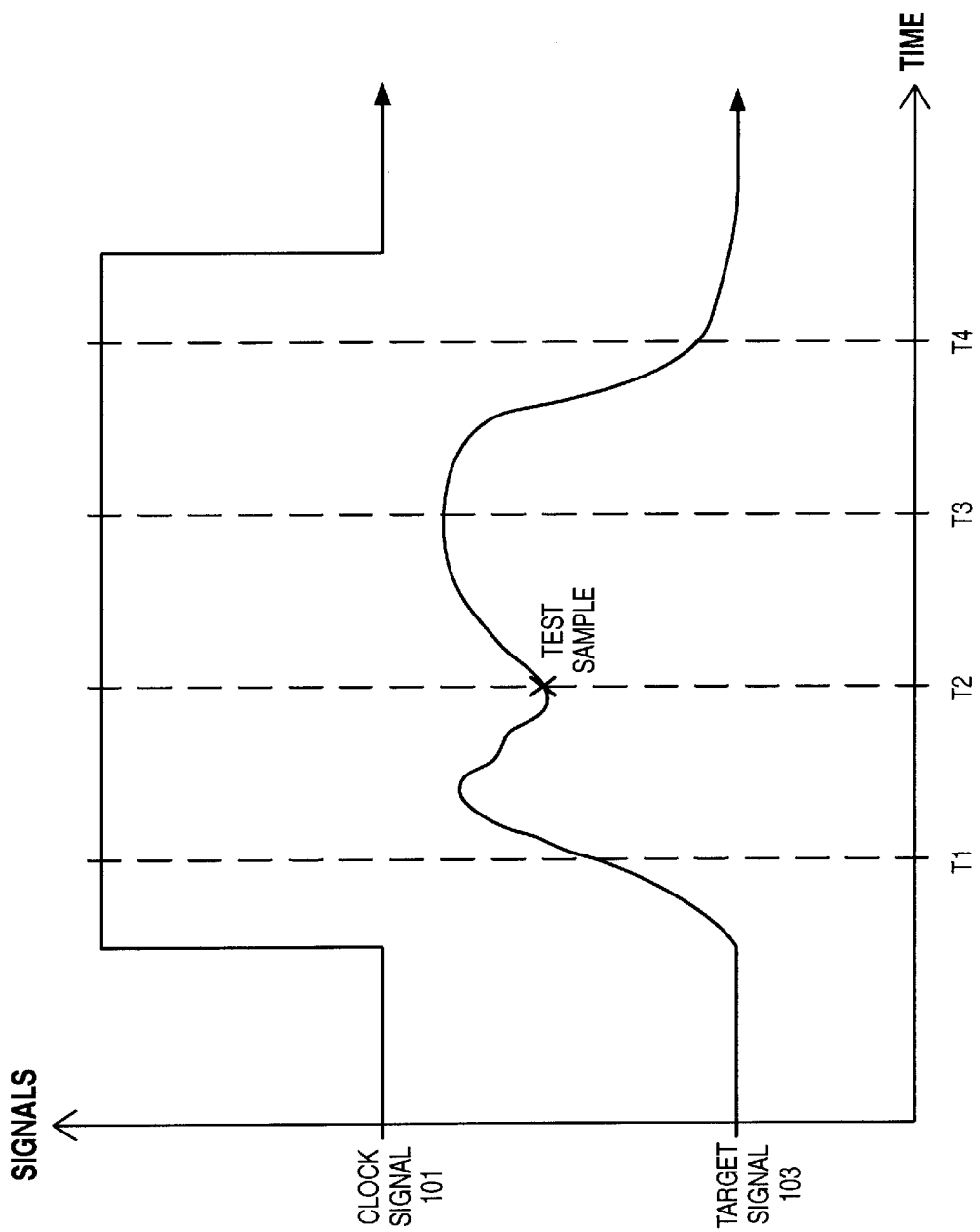
FIG. 2 is a timing diagram for an integrated circuit in an example of the invention.

Integrated Circuit Configuration and Operation—FIGS. 1–2

FIG. 1 is a block diagram that depicts the configuration of integrated circuitry 100. The integrated circuitry 100 is comprised of target circuitry 102 and test circuitry 104. The target circuitry 102 transfers a target signal 103. The target signal 103 could be any signal that is being tested. The integrated circuitry 100 could be a single integrated circuit chip or a set of chips.

The target circuitry 102 uses a clock signal 101 to transfer the target signal 103. The test circuitry 104 receives the clock signal 101, the target signal 103, and a test signal 105. The test signal 105 indicates a selected time within a clock cycle of the clock signal 101. Various time selections are possible. In response to the test signal 105, the test circuitry 104 samples the target signal 103 at the selected time to obtain a test sample. The test circuitry 103 produces a test signal 107 that indicates the test sample.

FIG. 2 is a timing diagram that depicts the operation of the integrated circuitry 100. The target signal 103 and a clock cycle of the clock signal 101 are shown synchronized in time above a time axis. Four possible times T1, T2, T3, and T4 are shown within the clock cycle. The test circuitry 104 samples the target signal 103 at the selected time indicated by the test signal 105. If the test signal 105 indicates T2, then the test circuitry 104 samples the target signal 103 at the time T2 to obtain the test sample. Advantageously, the test circuitry 104 obtains test samples in a controllable window within the clock cycle. By selecting various sample times, the target signal 103 can be analyzed for various characteristics, such as arrival delay (T1) and glitches (T2).

FIGS. 1–2 illustrate an example of the invention to those skilled in the art and are simplified for clarity by omitting some conventional components. Those skilled in the art will also appreciate variations from this example, such as the number of possible sample times and time selection criteria, that are within the scope of the invention.

Figure 3:
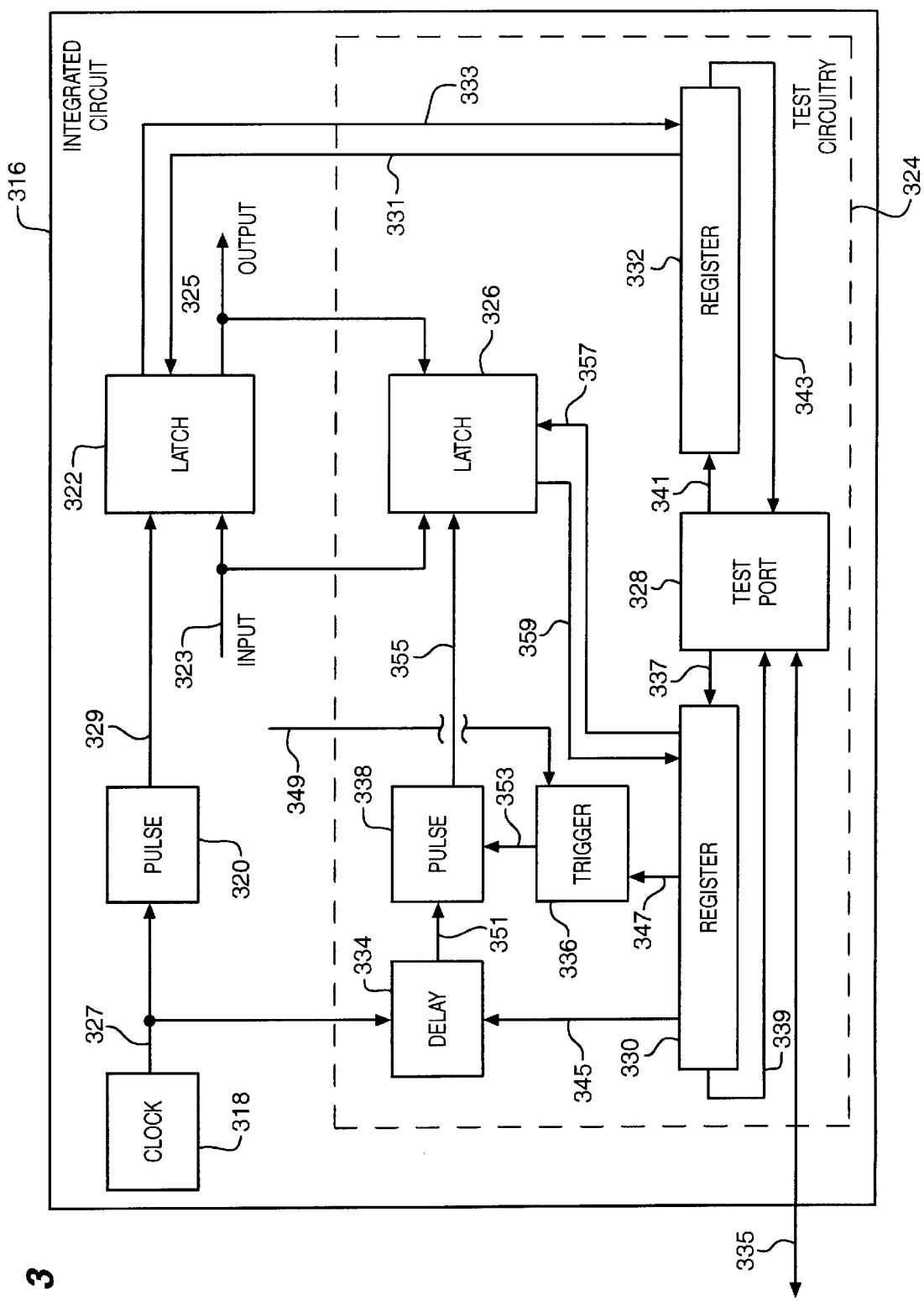
FIG. 3 is a block diagram of an integrated circuit with programmable delay and triggering in an example of the invention.
Figure 4:
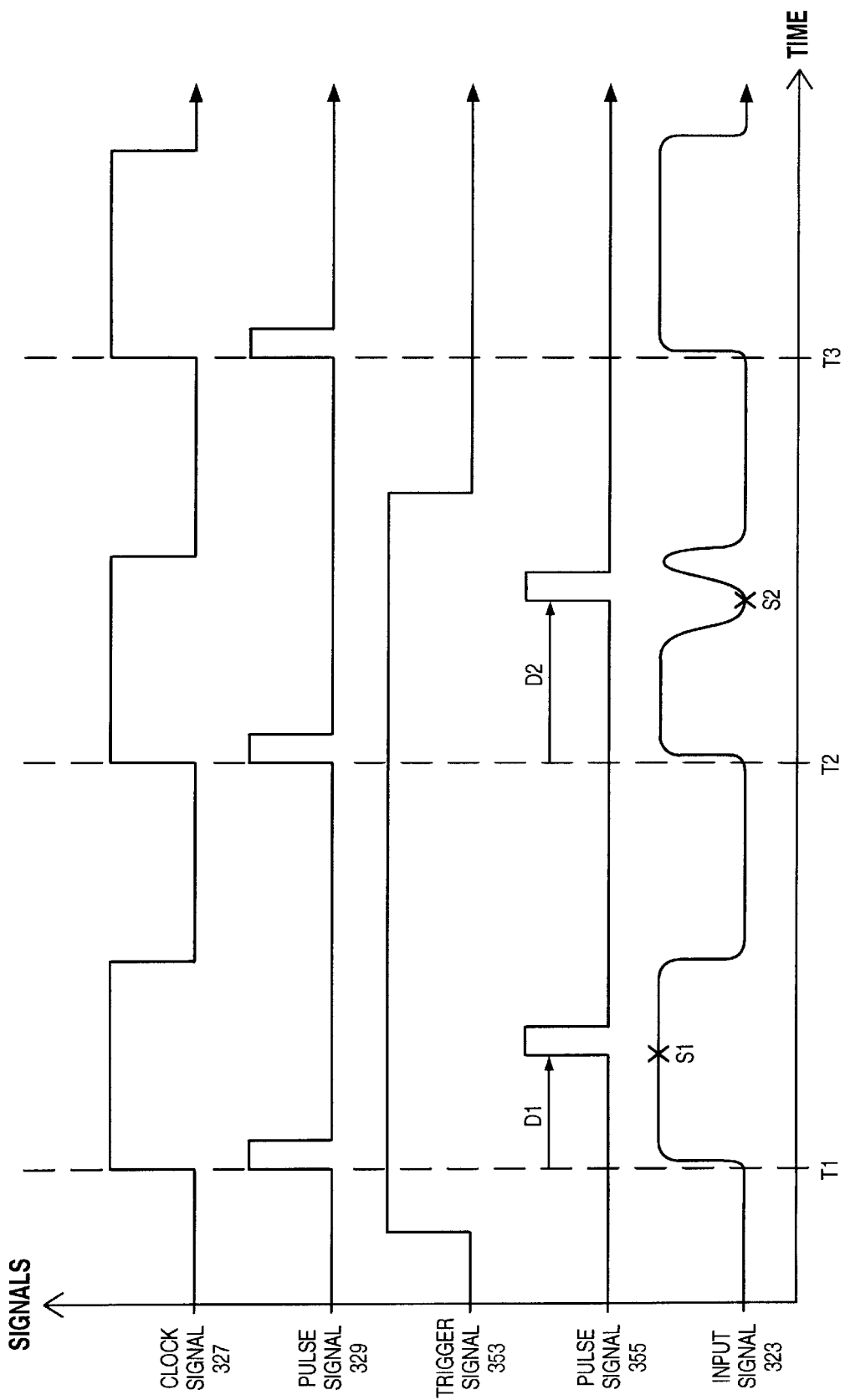
FIG. 4 is a timing diagram for an integrated circuit with programmable delay and triggering in an example of the invention.

Integrated Circuit With Programmable Delay and Trigger—FIGS. 3–4

FIGS. 3–4 depict a specific example of an integrated circuit in accord with the resent invention. Those skilled in the art will appreciate numerous variations from his example that do not depart from the scope of the invention. Those skilled in the art will also appreciate that various features described below could be combined with the above-described embodiment to form multiple variations of the invention.

FIG. 3 depicts an integrated circuit 316. The integrated circuit 316 comprises a clock 318, pulse generator 320, latch 322, and test circuitry 324. The test circuitry 324 comprises a latch 326, test port 328, shift register 330, shift register 332, delay circuit 334, trigger circuit 336, and pulse generator 338. The latch 326 is typically incorporated within the shift register 330, but is depicted externally for the purpose of clarity. All of these components could be conventional.

The integrated circuit 316 transfers signals between blocks of logic using thousands of latches, and the test circuitry 324 non-destructively samples these signals using thousands of other latches. The samples are used to analyze the integrated circuit 316 for performance defects. The latch 322 and the latch 326 are examples of these latches.

The clock 318 provides a clock signal 327 to the pulse generator 320 and to the delay circuit 334. At an edge of the clock cycle in the clock signal 327, the pulse generator 320 provides pulses in a pulse signal 329 to the latch 322. In response to a pulse, the latch 322 stores a new value based on an input signal 323 and outputs the stored value on an output signal 325. The latch 322 maintains the stored value until the next pulse.

The test port 328 exchanges test signals 335 with a test system that is external to the integrated circuit 316. The test signals 335 include test information that indicate a delay, a trigger condition, and an input/output signal selection. The test port 328 transfers the test information to the shift register 330. An example of the shift register 330 is described in U.S. Pat. No. 5,530,706. The shift register 330 provides a delay signal 345 that specifies the delay to the delay circuit 334. The shift register 330 provides a trigger signal 347 that specifies the trigger condition to the trigger circuit 334. The shift register 330 provides a latch signal 357 that indicates the input/output signal selection to the latch 326.

The shift register 330 receives a test signal 359 that indicates test samples from the latch 326. The shift register 330 also receives test samples from the other latches as well. The shift register 330 provides a test signal 339 indicating the test samples to the test port 328. The test port 328 provides the test samples in the test signal 335 to the external test system The delay circuit 334 receives and delays the clock signal 327 based on the programmed delay specified in the delay signal 345. The delay is specified digitally to provide fine resolution for precise sample time selection. The delay circuit 334 transfers a delayed clock signal 351 to the pulse generator 338.

The trigger circuit 336 receives an internal signal 349 from the integrated circuit 316. The internal signal 349 may come from a bus or memory and indicate instructions or states. The trigger circuit 336 compares the trigger condition to the internal signal 349, and if they match, the trigger circuit 336 provides a trigger signal 353 to the pulse generator 338. An example of the trigger circuit 336 is described in U.S. Pat. No. 5,867,644.

The pulse generator 338 generates a pulse in the pulse signal 355 to the latch 326 based on the delayed clock signal 351 and the trigger signal 353. In response to the pulse in the pulse signal 355, the latch 326 stores the value of either the input signal 323 or the output signal 325 based on the input/output signal selection. The stored value is a test sample in the test signal 359 that is provided to the shift register 330.

The test circuitry 324 can be configured with options. Default options include zero delay and/or no trigger requirement. Another default option includes the use of the clock signal 327 to drive the latch 326 to sample the output signal 325. The test port 328, shift register 332, and associated test signals 331, 333, 335, 341, and 343 can be used to scan the latch 322 in the conventional manner. These scans are destructive tests that require the integrated circuit 316 to cease operation and reset after the testing. The destructive tests are typically used to detect manufacturing defects.

FIG. 4 depicts the operation of the integrated circuit 316. The clock signal 327, pulse signal 329, trigger signal 353, pulse signal 355, and input signal 323 are shown synchronized in time above a time axis. The clock signal 327 has clock cycles with edges at times T1, T2, and T3. The pulse signal 329 has corresponding pulses at times T1, T2, and T3 that drive the latch 322 to store values from the input signal 323. Typically, a time period between T1 and T2 is required to shift the stored values out of the latch 326, but this time period is not depicted for the purpose of clarity.

The trigger signal 353 goes high prior to T1 indicating that the internal signal 349 matches the trigger condition. When the trigger signal 353 is high, the pulse signal 355 has pulses after the selected delays from the edge of the clock cycle. The pulse signal 355 has a first pulse in the middle of the first clock cycle after the selected delay D1 from the time T1. The pulse signal 355 has a second pulse near the end of the second clock cycle after the selected delay D2 from the time T2. Since the trigger signal 353 goes low between T2 and T3, there is no pulse during the third clock cycle. The first and second pulses in the pulse signal 355 drive the latch 326 to store sample values S1 and S2 from the input signal 323 (assuming the input signal is selected). Note that the delay D2 results in a sample S2 that detects a glitch in the input signal 323.

It should be appreciated that numerous signals within the integrated circuit 316 can be non-destructively sampled while the integrated circuit 316 is operating. By specifying the trigger condition, sampling automatically occurs in response to an event within the integrated circuit 316. By specifying the delay, sampling occurs at a selected time point within the clock cycle. Thus, the invention provides precise and robust testing of an operational integrated circuit.

Those skilled in the art will appreciate variations of the above-described embodiments that fall within the scope of the invention. As a result, the invention is not limited to the specific examples and illustrations discussed above, but only by the following claims and their equivalents.

What is claimed is:

1. Integrated circuitry comprising:
   target circuitry configured to use a clock signal to transfer a target signal within the integrated circuitry; and
   test circuitry configured to sample the target signal at a selected time from a plurality of possible times within a clock cycle of the clock signal in response to a test signal indicating the selected time.

2. The integrated circuitry of claim 1 wherein the selected time is a delay from a time point in the clock signal.

3. The integrated circuitry of claim 2 wherein the test circuitry is configured to generate a pulse after the delay and to sample the target signal in response to the pulse.

4. The integrated circuitry of claim 2 wherein the delay is specified as a digital number and the test circuitry is configured to receive the test signal from an external system.

5. The integrated circuitry of claim 1 wherein the test circuitry is configured to sample the target signal in response to a trigger.

6. The integrated circuitry of claim 5 wherein the test circuitry is configured to compare a trigger condition to another signal from the integrated circuitry and to generate the trigger if the trigger condition matches the other signal.

7. The integrated circuitry of claim 6 wherein the test signal indicates the trigger condition and the test circuitry is configured to receive the test signal from an external system.

8. The integrated circuitry of claim 1 wherein the target signal is either an input to a storage element in the target circuitry or an output from the storage element in the target circuitry and wherein the test circuitry is configured to sample either the input or the output in response to an input/output selection.

9. The integrated circuitry of claim 8 wherein the test signal indicates the input/output selection and the test circuitry is configured to receive the test signal from an external system.

10. The integrated circuitry of claim 1 wherein the test circuitry is configured to non-destructively sample the target signal and to transfer the sample to an external system.

11. A method for operating integrated circuitry comprising:
using a clock signal to transfer a target signal within the integrated circuitry; and
sampling the target signal at a selected time from a plurality of possible times within a clock cycle of the clock signal in response to a test signal indicating the selected time.

12. The method of claim 11 wherein the selected time is a delay from a time point in the clock signal.

13. The method of claim 12 wherein sampling the target signal comprises generating a pulse after the delay and sampling the target signal in response to the pulse.

14. The method of claim 12 wherein the delay is specified as a digital number and further comprising receiving the test signal into the integrated circuitry from an external system.

15. The method of claim 11 wherein sampling the target signal comprises sampling the target signal in response to a trigger.

16. The method of claim 15 comprising comparing a trigger condition to another signal from the integrated circuitry and generating the trigger if the trigger condition matches the other signal.

17. The method of claim 16 wherein the test signal indicates the trigger condition and further comprising receiving the test signal into the integrated circuitry from an external system.

18. The method of claim 11 wherein the target signal is either an input to a storage element in the target circuitry or an output from the storage element in the target circuitry and wherein sampling the target signal comprises sampling either the input or the output in response to an input/output selection.

19. The method of claim 18 wherein the test signal indicates the input/output selection and further comprising receiving the test signal into the integrated circuitry from an external system.

20. The method of claim 11 wherein sampling the target signal comprises non-destructively sampling the target signal and further comprising transferring the sample to an external system.

* * * * *